US010106892B1

(12) United States Patent
Siddiqui et al.

(10) Patent No.: US 10,106,892 B1
(45) Date of Patent: Oct. 23, 2018

(54) THERMAL OXIDE EQUIVALENT LOW TEMPERATURE ALD OXIDE FOR DUAL PURPOSE GATE OXIDE AND METHOD FOR PRODUCING THE SAME

(71) Applicant: GLOBALFOUNDRIES Inc., Grand Cayman (KY)

(72) Inventors: Shahab Siddiqui, Cifton Park, NY (US); Abu Naser Zainuddin, Clifton Park, NY (US); Beth Baumert, Ballston Lake, NY (US); Suresh Uppal, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/692,816

(22) Filed: Aug. 31, 2017

(51) Int. Cl.
| H01L 21/02 | (2006.01) |
| H01L 21/306 | (2006.01) |
| C23C 16/455 | (2006.01) |
| C01B 33/149 | (2006.01) |
| C01B 21/06 | (2006.01) |
| C01F 7/02 | (2006.01) |
| C01F 17/00 | (2006.01) |

(52) U.S. Cl.
CPC .... *C23C 16/45536* (2013.01); *C01B 21/0602* (2013.01); *C01B 33/149* (2013.01); *H01L 21/0228* (2013.01); *H01L 21/30604* (2013.01); *C01F 7/02* (2013.01); *C01F 17/0043* (2013.01)

(58) Field of Classification Search
None
See application file for complete search history.

(56) References Cited

U.S. PATENT DOCUMENTS

| 6,620,702 | B2 | 9/2003 | Shih et al. |
| 9,006,064 | B2 | 4/2015 | Chudzik et al. |
| 9,741,720 | B1* | 8/2017 | Siddiqui ............. H01L 27/0924 |
| 9,875,902 | B2* | 1/2018 | Colinge ............ H01L 21/28518 |
| 2015/0179459 | A1 | 6/2015 | Chudzik et al. |
| 2016/0225871 | A1* | 8/2016 | Cheng ............. H01L 21/823842 |
| 2017/0229558 | A1* | 8/2017 | Anderson ......... H01L 29/66795 |
| 2017/0358664 | A1* | 12/2017 | Cheng ............... H01L 29/66795 |
| 2018/0053823 | A1* | 2/2018 | Mallela ................. H01L 21/764 |
| 2018/0122709 | A1* | 5/2018 | Xie ................... H01L 29/66545 |

* cited by examiner

*Primary Examiner* — Asok K Sarkar
(74) *Attorney, Agent, or Firm* — Ditthavong & Steiner, P.C.

(57) ABSTRACT

Methods of forming conformal low temperature gate oxides on a HV I/O and a core logic and the resulting devices are provided. Embodiments include providing a HV I/O and core logic laterally separated on a Si substrate, each having a fin; forming a gate oxide layer over each fin and the Si substrate; forming a silicon oxy-nitride layer over the gate oxide layer; forming a sacrificial oxide layer over the silicon oxy-nitride layer; removing the sacrificial oxide and silicon oxy-nitride layers and thinning the gate oxide layer; forming a second gate oxide layer over the thinned gate oxide layer; forming a silicon oxy-nitride layer over the second gate oxide layer; removing the silicon oxy-nitride and second gate oxide layers over the core logic fin portion; forming an IL over the core logic fin portion; and forming a $HfO_x$ layer over the second silicon oxy-nitride layer and ILs.

15 Claims, 10 Drawing Sheets

US 10,106,892 B1

THERMAL OXIDE EQUIVALENT LOW TEMPERATURE ALD OXIDE FOR DUAL PURPOSE GATE OXIDE AND METHOD FOR PRODUCING THE SAME

TECHNICAL FIELD

The present disclosure relates to the manufacture of semiconductor devices, such as integrated circuits (ICs). The present disclosure is particularly applicable to replacement metal gates (RMGs), particularly for the fin field-effect transistor (FINFET) based 7 nanometer (nm) technology node and beyond.

BACKGROUND

As the dimensions of ICs decrease, the thickness of the gate oxide is reduced to maintain performance with the decreased gate length. Conventional gate stacks have become increasingly unsuitable due to uncontrolled fin to fin spacing, breakdown voltage ($V_{bd}$) deterioration, and bridge defect as the gate dielectric is thinned proportionally to the decreased gate length.

A need therefore exists for methodology enabling conformal low temperature oxide as a gate oxide for scaled FINFET.

SUMMARY

An aspect of the present disclosure is a method of forming conformal low temperature gate oxide on a high voltage input/output (HV I/O) and a core logic.

Another aspect of the present disclosure is a device with conformal low temperature gate oxide on a HV I/O and a core logic.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a HV I/O and a core logic laterally separated on a silicon (Si) substrate, each HV I/O and core logic having a fin; forming a first gate oxide layer over each fin and the Si substrate; forming a first silicon oxy-nitride layer over the first gate oxide layer; forming a sacrificial oxide layer over the silicon oxy-nitride layer; removing the sacrificial oxide and first silicon oxy-nitride layers and thinning the first gate oxide layer; forming a second gate oxide layer over the thinned gate oxide layer; forming a second silicon oxy-nitride layer over the second gate oxide layer; removing the second silicon oxy-nitride and gate oxide layers over the core logic fin and a portion of the Si substrate; forming an interfacial layer (IL) over the core logic fin and the portion of the Si substrate; and forming a hafnium oxide (HfOx) layer over the second silicon oxy-nitride layer and ILs.

Aspects of the present disclosure include forming the first gate oxide layer by: forming ALD silicon dioxide ($SiO_2$) by plasma-enhanced atomic layer deposition (PEALD) or thermal ALD at a temperature of 385° C. to 425° C.; and performing a remote plasma treatment using oxygen ($O_2$) or ozone ($O_3$) gas to generate radical $O_2$ for ALD $SiO_2$ growth. Further aspects include forming the first silicon oxy-nitride layer by: plasma nitridation at a room temperature and up to 450° C. with 9% to 12% of nitrogen (N); and post nitridation annealing at a temperature of 900° C. to 1000° C. for 30 seconds to 60 seconds. Another aspect includes forming the second silicon oxy-nitride layer by plasma nitridation and annealing 3% to 5% of N at a room temperature and up to 450° C. Additional aspects include the sacrificial oxide layer including titanium dioxide ($TiO_2$), aluminium oxide ($Al_2O_3$), silicon nitride ($Si_3N_4$), lanthanum oxide ($LaO_x$), $SiO_2$, thermal ALD oxide or $HfO_x$. Another aspect includes the first and second gate oxide layers including $SiO_2$ or thermal ALD oxide. Further aspects include the thinned gate and second gate oxide layer are an inner spacer. Additional aspects include removing the sacrificial oxide layer by dilute hydrofluoric acid (dHF) etching. Further aspects include thinning the first gate oxide layer to a thickness of 22 Å to 35 Å by wet etching, wherein the wet etching includes a 100:1 dHF solution (100 parts water ($H_2O$), 1 part HF). Another aspect includes removing the second silicon oxy-nitride and thinned gate oxide layer over the core logic fin and the portion of the Si substrate by: forming a photoresist over the second silicon oxy-nitride layer over the HV I/O fin and the portion of the Si substrate; removing the second silicon oxy-nitride layer over the thinned gate oxide layer over the core logic fin by ultraviolet (UV) lithography; removing the thinned gate oxide layer over the core logic fin and the portion of the Si substrate by dHF etching; and removing the photoresist. Additional aspects include forming the IL over the core logic fin by $O_3$/HCL process.

Another aspect of the present disclosure is a device including: a HV I/O and a core logic laterally separated over a Si substrate, the HV I/O and core logic each having a fin; a first and second gate oxide layers over the HV I/O fin and adjacent portions of the Si substrate; a silicon oxy-nitride layer over the second gate oxide layer; an IL over the core logic fin and adjacent portions of the Si substrate; and a $HfO_x$ layer over the silicon oxy-nitride layer and the IL.

Aspects of the device include the first gate oxide layer having a thickness of 22 Å to 35 Å. Another aspect includes the second gate oxide layer having a thickness of 1 Å to 35 Å. Other aspects include the IL having a thickness of 6 Å to 12 Å. A further aspect includes the $HfO_x$ layer having a thickness of 15 Å to 28 Å.

A further aspect of the present disclosure is a method including: providing a HV I/O and a core logic laterally separated on a Si substrate, each HV I/O and core logic having a fin; forming a first gate oxide layer to a thickness of 30 Å to 45 Å over each fin and the Si substrate by PEALD or thermal ALD at a temperature of 385° C. to 425° C., and performing a remote plasma treatment using $O_2$ or $O_3$ gas to generate radical $O_2$ for ALD $SiO_2$ growth; forming a first silicon oxy-nitride layer over the first gate oxide layer by plasma nitridation at a room temperature and up to 450° C. with 9% to 12% of N, and post nitridation annealing at a temperature of 900° C. to 1000° C. for 30 seconds to 60 seconds; forming a sacrificial oxide layer over the silicon oxy-nitride layer by PEALD; removing the sacrificial oxide and first silicon oxy-nitride layers by dHF etching; thinning the gate oxide layer to a thickness of 22 Å to 35 Å by wet etching; forming a second gate oxide layer to a thickness of 1 Å to 35 Å over the thinned gate oxide layer by PEALD or thermal ALD; forming a second silicon oxy-nitride layer over the second gate oxide layer; removing the second silicon oxy-nitride and gate oxide layers over the core logic fin and a portion of the Si substrate by UV lithography and dHF etching, respectively; forming an IL to a thickness of 6 Å to 12 Å over the core logic fin and the portion of the Si substrate by $O_3$/HCL process; and forming a HfOx layer to a thickness of 15 Å to 28 Å over the second silicon oxy-nitride layer and ILs by ALD.

Aspects of the present disclosure include the sacrificial oxide layer including $TiO_2$, $Al_2O_3$, $Si_3N_4$, $LaO_x$, $SiO_2$, thermal ALD oxide or $HfO_x$. Another aspect includes the first and second gate oxide layers including $SiO_2$ or thermal ALD oxide. Further aspect includes the wet etching including a 100:1 dHF solution (100 parts $H_2O$, 1 part HF).

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of fin to fin spacing, bridge defects, and uncontrolled $V_{bd}$ and inversion layer capacitance (Cinv) attendant upon forming conformal low temperature oxides as gate oxides. The problems are solved, inter alia, by depositing a thermal oxide quality equivalent oxide with conformal thickness on a HV I/O and a core logic resulting in fin to fin spacing control during fin integration, a well-controlled $V_{bd}$ and Cinv, and a reduction in bridge defect by printing smaller fins.

Methodology in accordance with embodiments of the present disclosure includes providing a HV I/O and a core logic laterally separated on a Si substrate, each HV I/O and core logic having a fin. A first gate oxide layer is formed over each fin and the Si substrate, and a first silicon oxy-nitride layer is formed over the first gate oxide layer. A sacrificial oxide layer is formed over the first silicon oxy-nitride layer. Then, the sacrificial oxide and first silicon oxy-nitride layers are removed and the first gate oxide layer is thinned. A second gate oxide layer is formed over the thinned gate oxide layer, and a second silicon oxy-nitride layer is formed over the second gate oxide layer. Next, the second silicon oxy-nitride and gate oxide layers are removed over the core logic fin and a portion of the Si substrate. An IL is formed over the core logic fin and the portion of the Si substrate, and a HfOx layer is formed over the second silicon oxy-nitride layer and ILs.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
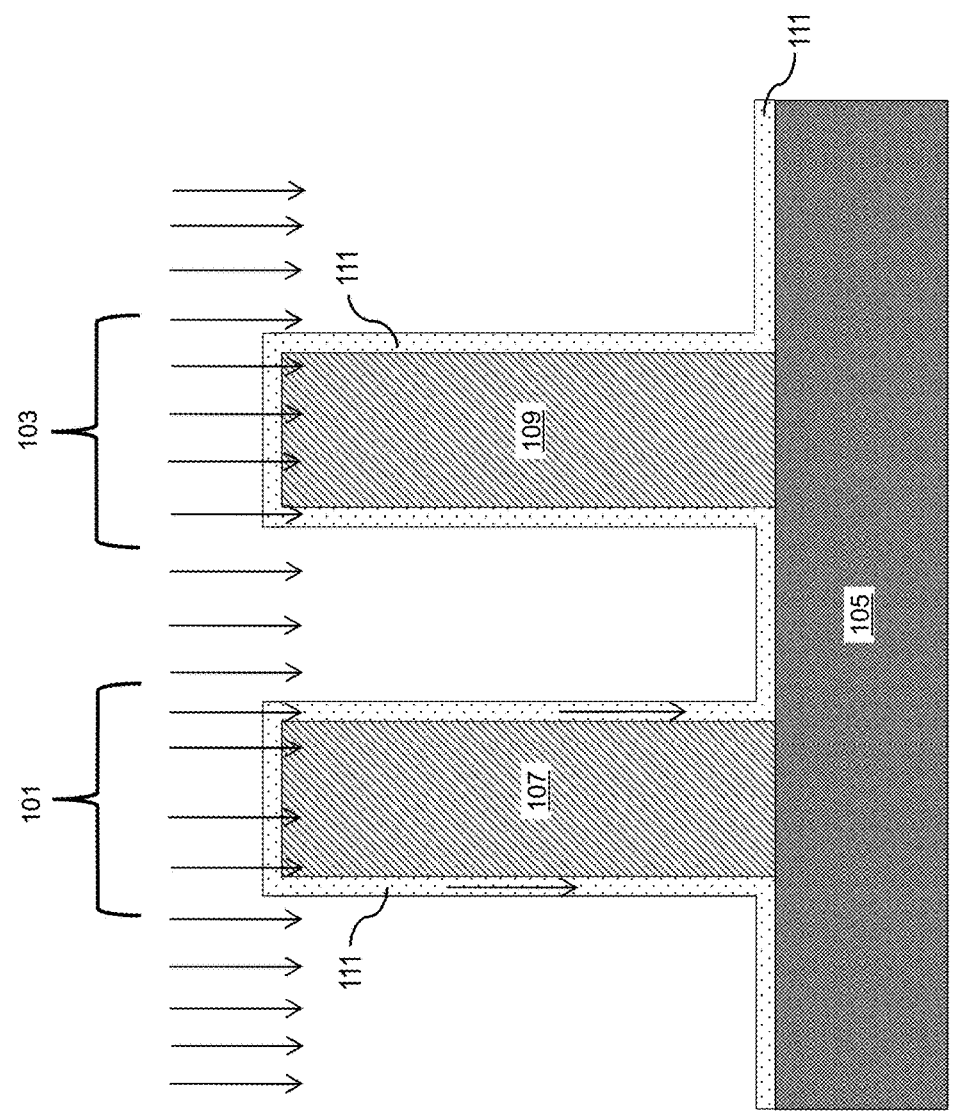
FIGS. 1 through 10 schematically illustrate cross-sectional views of a process flow for forming conformal low temperature gate oxide on a HV I/O and a core logic, in accordance with an exemplary embodiment.
Figure 2:
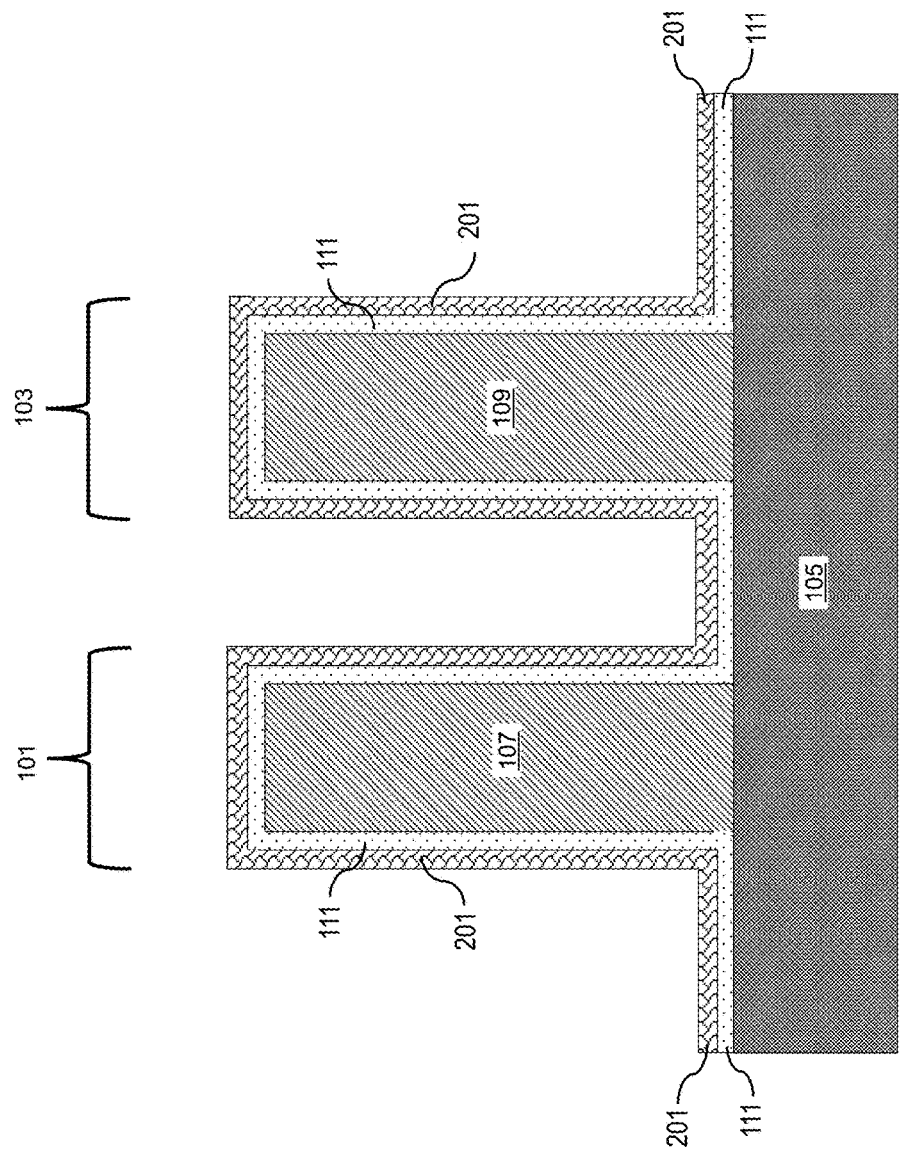
Figure 3:
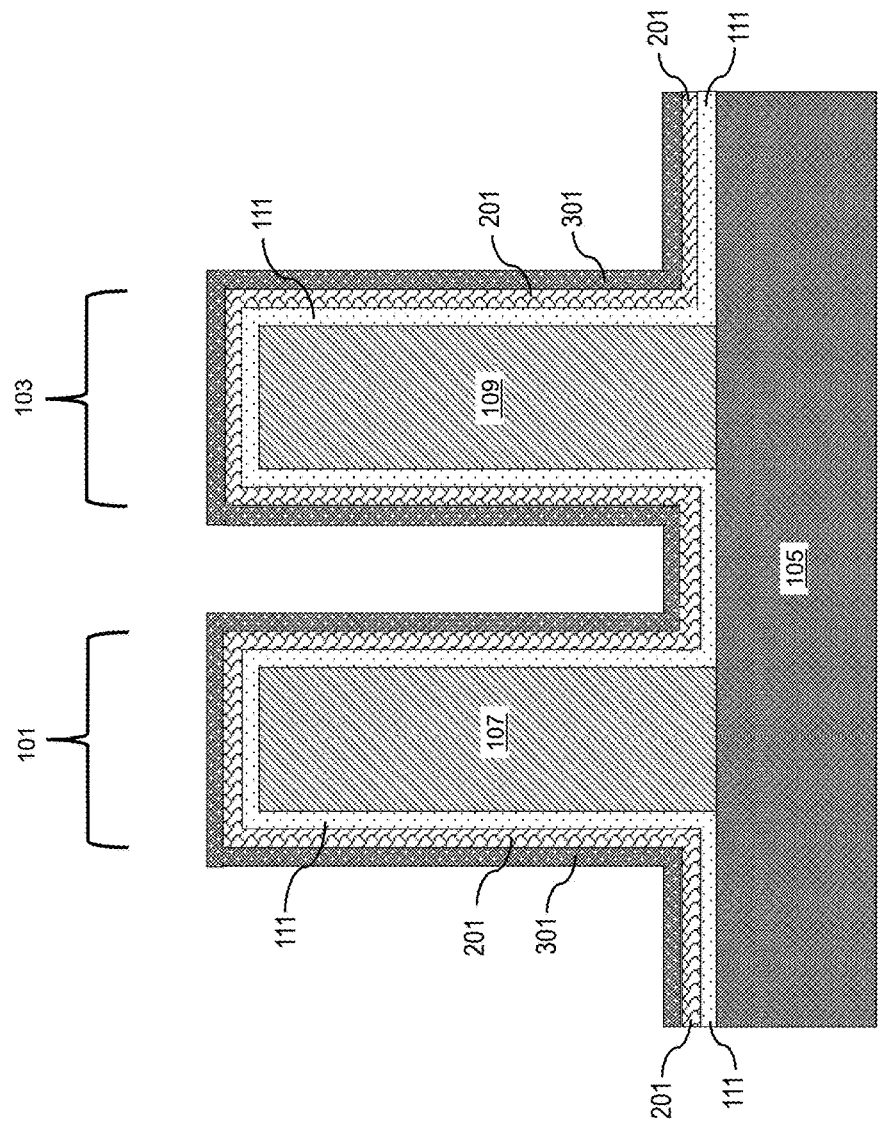
Figure 4:
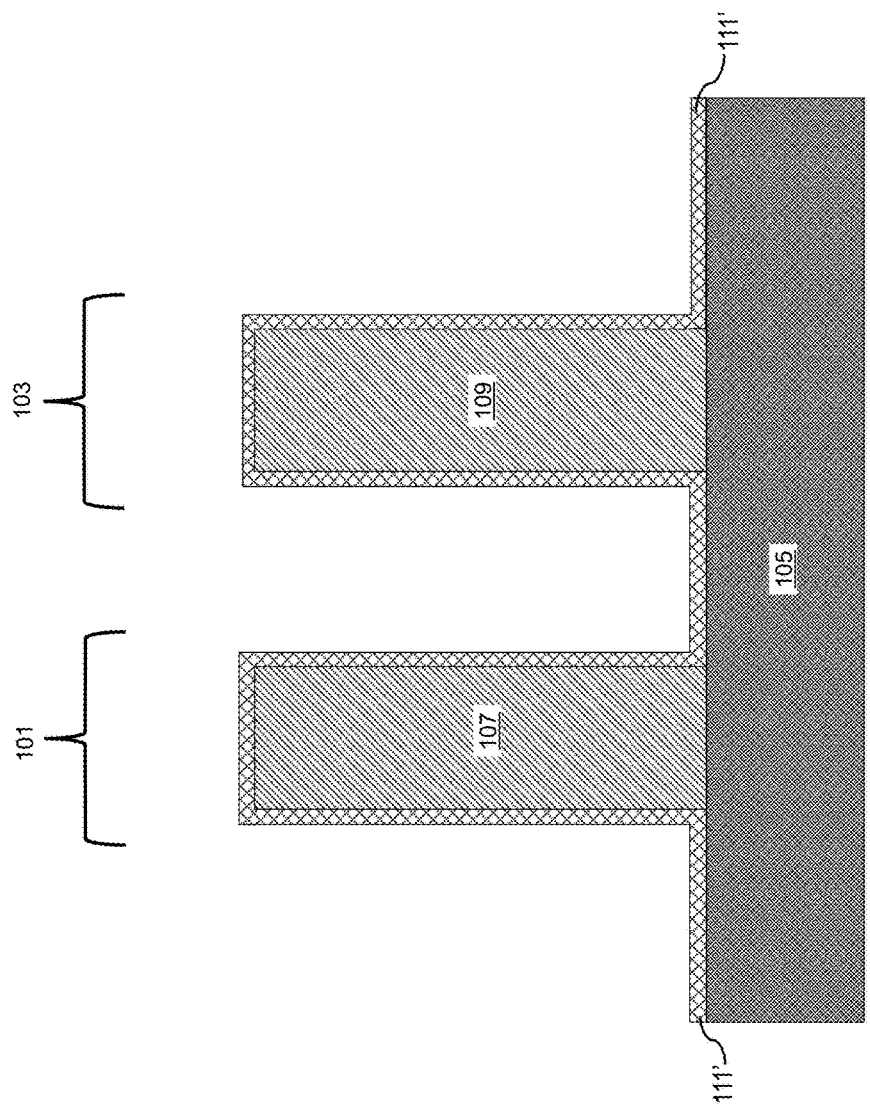
Figure 5:
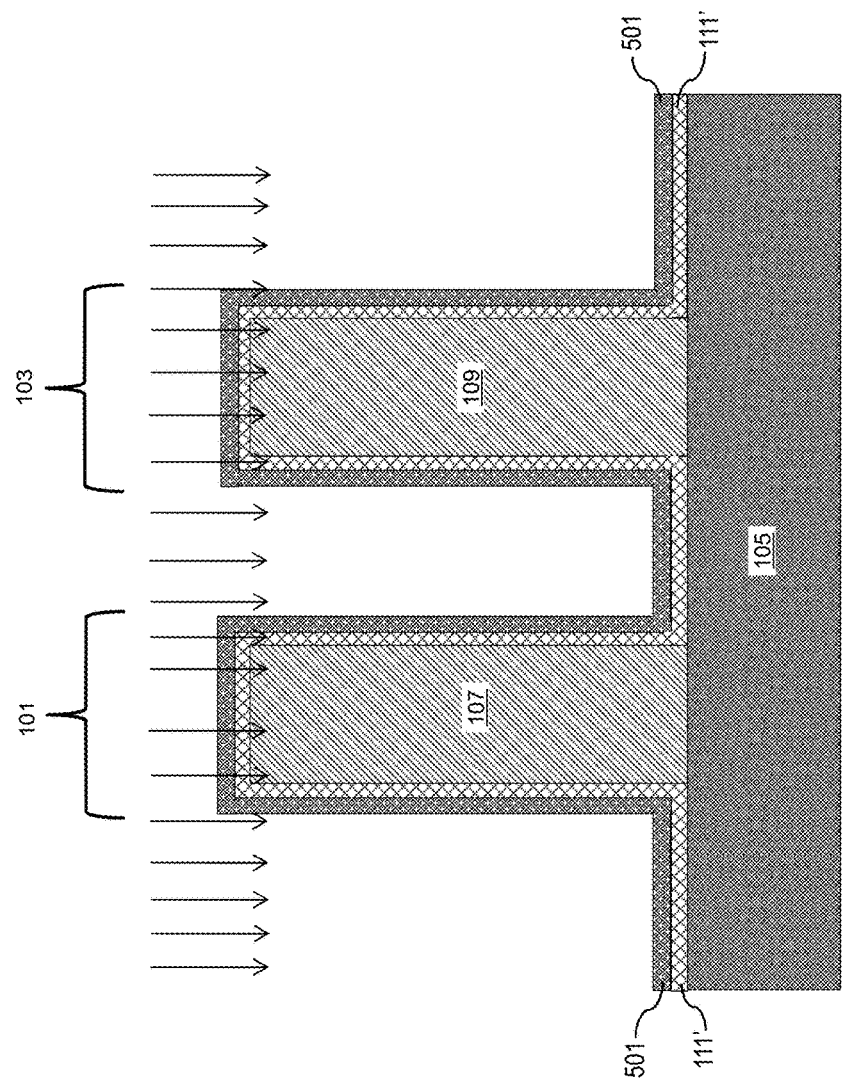
Figure 6:
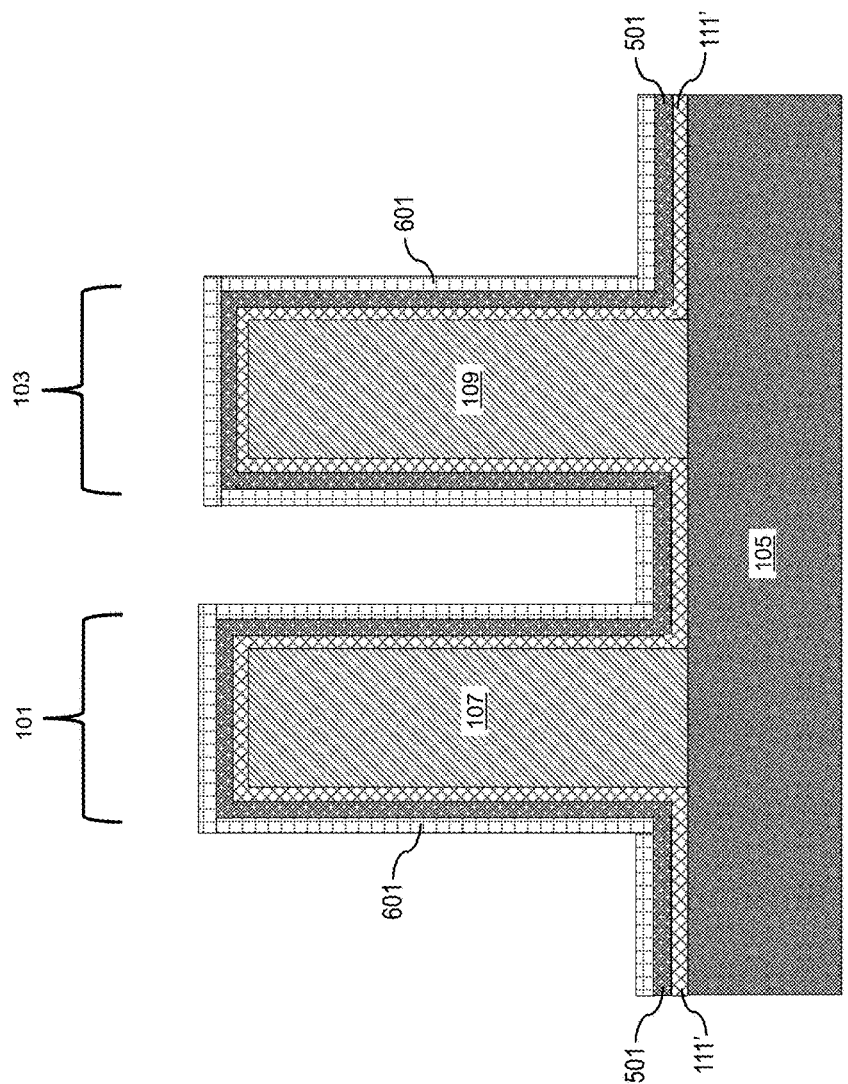

FIGS. 1 through 10 schematically illustrate cross-sectional views of a process flow for forming conformal low temperature gate oxide on a HV I/O and a core logic, in accordance with an exemplary embodiment. Adverting to FIG. 1, a HV I/O 101 and a core logic 103 are laterally separated on a Si substrate 105. The Si substrate 105 may include II-IV (silicon-germanium (SiGe), germanium (Ge)), III-V gallium nitride (GaN), aluminium gallium nitride (AlGaN), Indium Nitride (InN), or antimonides. In this instance, the HV I/O 101 may include an extended gate (EG) and the core logic 103 may include a single gate (SG). The HV I/O 101 and the core logic 103 have fins 107 and 109, respectively. A conformal gate oxide layer 111 is formed, e.g., of $SiO_2$ or thermal ALD oxide, over the Si substrate 105 and fins 107 and 109 by PEALD or thermal ALD. The PEALD or thermal ALD process may use $O_2$ or $O_3$ gas as a nucleation site to generate radical $O_2$ with Si precursor at a temperature of 385° C. to 425° C. to form the conformal gate oxide layer 111. The gate oxide layer 111 may be formed, e.g., to a thickness of 30 Å to 45 Å. As depicted in FIG. 2, a silicon oxy-nitride layer 201 is formed over the gate oxide layer 111 by plasma nitridation, e.g., 9% to 12% of $N_2$, $N_2$/helium (He) gas, at a room temperature and up to 450° C. Then, a post nitridation annealing is performed, e.g., at a temperature of 900° C. to 1000° C. for 30 seconds to 60 seconds in a N containing ambient. As illustrated in FIG. 3, a sacrificial oxide layer 301 is formed over the silicon oxy-nitride layer 201 by PEALD. The PEALD process may again use radical $O_2$ with Si precursor at a temperature of 385° C. to 500° C. to form conformal $SiO_2$ or thermal ALD oxide. The sacrificial oxide layer 301 may also include $TiO_2$, $Al_2O_3$, $Si_3N_4$, $LaO_x$, or $HfO_x$. The sacrificial oxide layer 301 and the silicon oxy-nitride layer 201 are then removed by dHF etching. Then, the gate oxide layer 111 is thinned, e.g., to a thickness of 22 Å to 35 Å, by wet etching forming the gate oxide layer 111', as depicted in FIG. 4. The wet etching includes a 100:1 dHF solution (100 parts $H_2O$, 1 part HF) or any combination of dHF:water may be used based on the oxide required to be removed. Adverting to FIG. 5, a gate oxide layer 501 is formed, e.g., to a thickness of 1 Å to 35 Å, over the thinned gate oxide layer 111' by PEALD, e.g., at a temperature of 400° C., with radical $O_2$ using Si precursor or a thermal ALD process using $O_3$ and Si precursor at a temperature of 385° C. to 400° C. The gate oxide layer 501 may also be subjected to surface treatment processes, such as, decoupled plasma oxidation (DPO) and decoupled plasma nitridation (DPN) in various environments to achieve the desired work function of the material. A silicon oxy-nitride layer 601 is then formed over the gate oxide layer 501 by plasma nitridation and annealing, e.g., 3% to 5% of $N_2$, $N_2$/He gas at a room temperature and up to 450° C., as depicted in FIG. 6. Consequently, the thinned gate oxide layer 111 and gate oxide layer 501 are an inner spacer, thereby improving gate contact extrinsic $V_{bd}$ for high voltage I/O devices.

Figure 7:
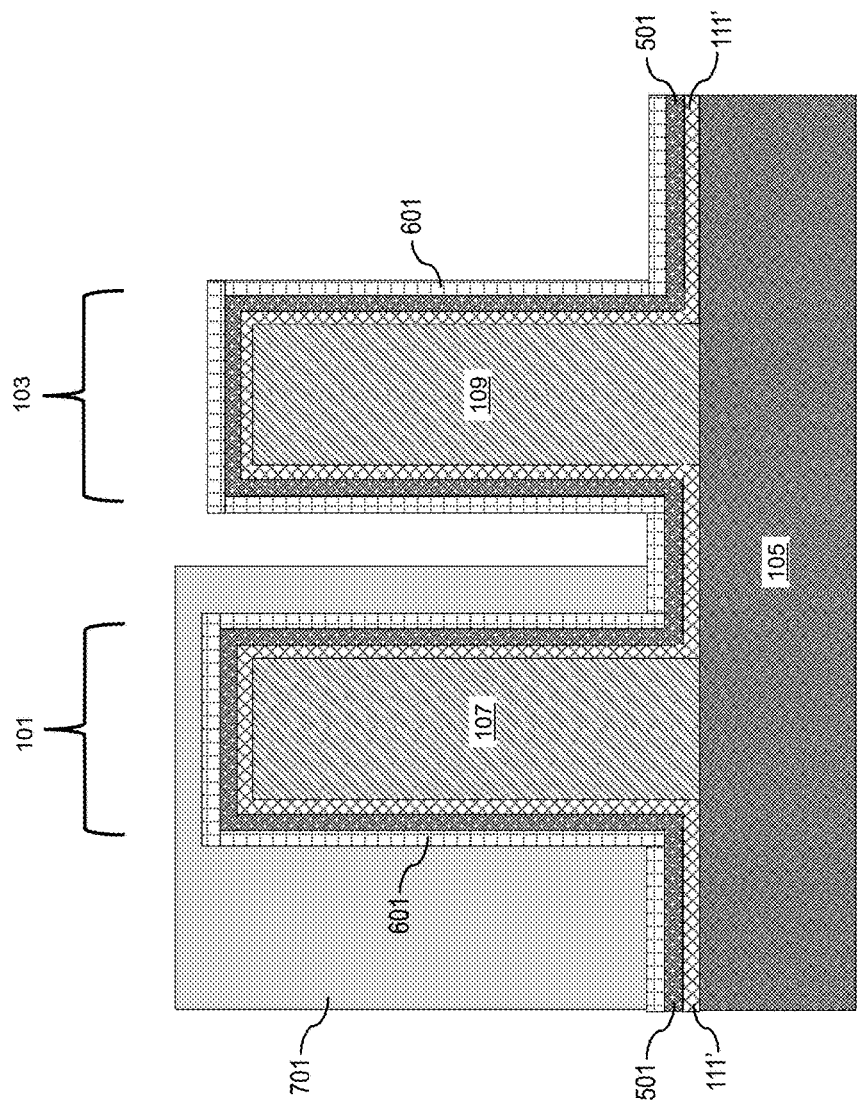
Figure 8:
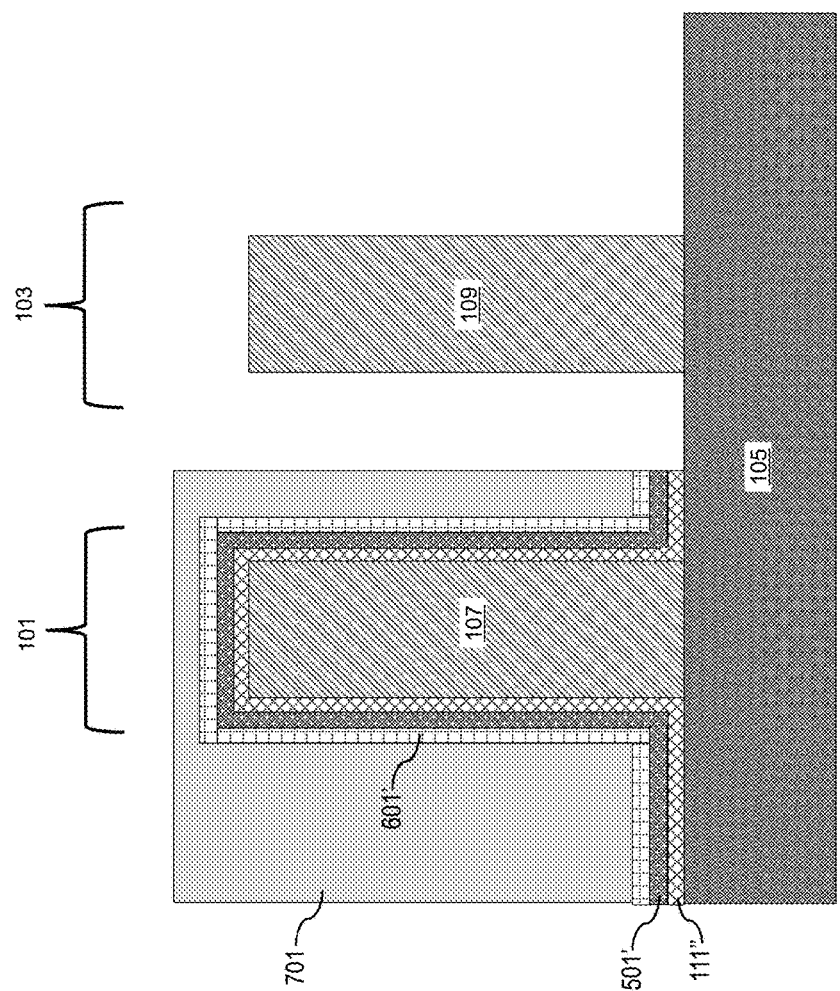
Figure 9:
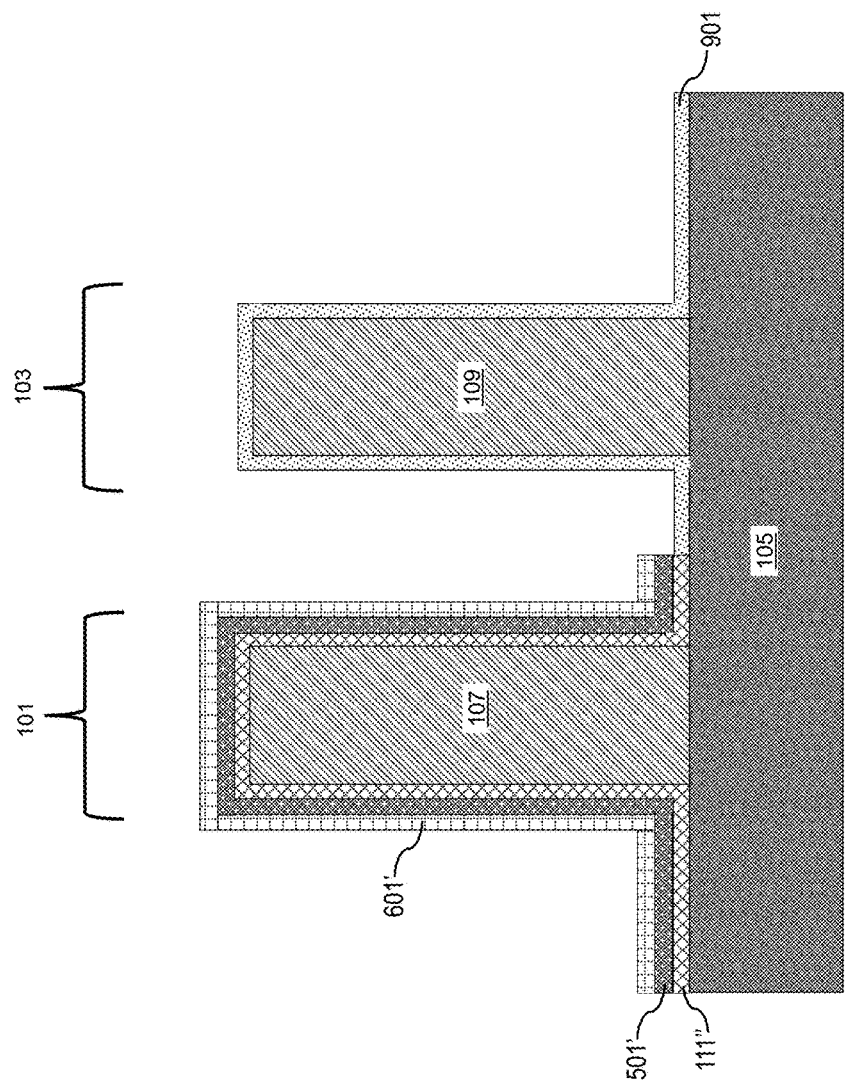
Figure 10:
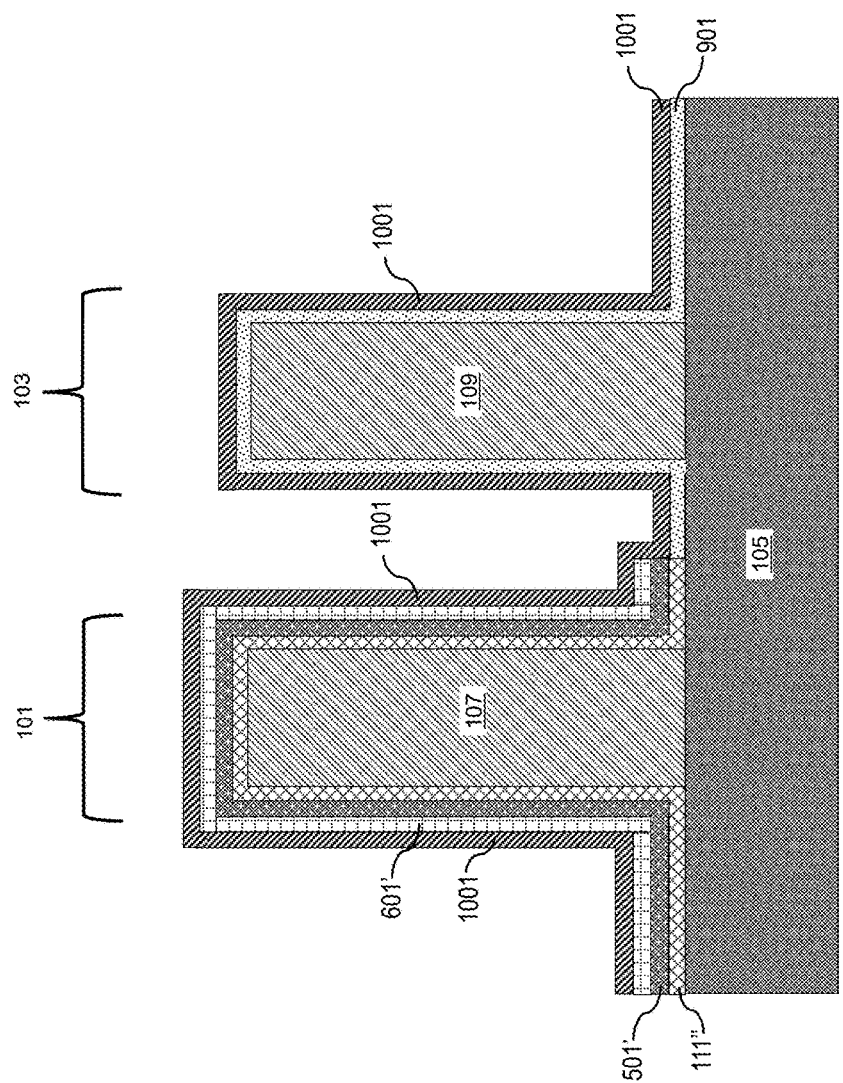

Adverting to FIG. 7, a photoresist 701 is formed over the HV I/O 101 and a portion of the Si substrate 105 by positive tune photoresist process using a 193 nm or 248 nm dry lithography process. The silicon oxy-nitride layer 601 and gate oxide layer 501 over the core logic 103 and a portion of the Si substrate 105 are then removed by UV lithography forming the silicon oxy-nitride layer 601' and gate oxide layer 501', as depicted in FIG. 8. Next, the thinned gate oxide layer 111' over the core logic 103 and a portion of the Si substrate 105 is removed by dHF etching, e.g., 100:1 dHF and gas phase dHF process selective to the Si substrate 105, forming the thinned gate oxide layer 111". Adverting to FIG. 9, an IL 901 is formed, e.g., to a thickness of 6 Å to 12 Å, over the fin 109, core logic 103 and a portion of the Si substrate 105 by $O_3$/HCL process, e.g., $O_3$ is a deionized (DI) water where $O_3$ is generated by an $O_3$ generator, then the DI ozonated water is delivered to the wafer growing a thin layer of chemical oxide in the range of 8 Å to 10 Å. The photoresist 701 is then removed by sulfuric acid and hydrogen peroxide ($H_2O_2$) (also known as sulfuric acid/hydrogen peroxide mixture (SPM)) at a temperature of 140° C. Then, a standard clean 1 (SC1) is performed to remove organic particles. As illustrated in FIG. 10, a $HfO_x$ layer 1001 is formed, e.g., to a thickness of 15 Å to 28 Å, over the silicon oxy-nitride layer and IL layer 601' and 901, respectively, by ALD using hafnium tetrachloride ($HfCl_4$)/($H_2O$) at a temperature of 350° C. to 400° C.

The embodiments of the present disclosure can achieve several technical effects, such as enabling use of an ALD oxide as an input/output (I/O) gate oxide at fin level, which allows fin scaling and better oxide control, and match thermal oxide $V_{bd}$ and negative bias instability. In addition, the ALD oxide allows for additional oxide to be formed on the side wall of the gate (PC) in the HV I/O gate to overcome HV I/O PC to source/drain (TS) (PC-TS) $V_{bd}$, i.e., a "spacer" is formed inside the HV I/O gate without requiring an additional mask step. Further, sacrificial oxidation (SacOX)/thermal oxidation (TO) allows filling of any ledges under spacers by sacrificial oxide deposition and removal process, and thin ALD $SiO_2$ deposition in RMG trench (top off) to make up for any gate oxide loss caused by dummy gate removal and sacrificial oxide removal. Furthermore, the dual purpose dielectric in a gate improves the PC-TS $V_{bd}$. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in nanowire technology as an inner spacer, gate all around technology as an I/O gate oxide, and any of various types of highly integrated finFET semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a high voltage input/output (HV I/O) and a core logic laterally separated on a silicon (Si) substrate, each HV I/O and core logic having a fin;
    forming a first gate oxide layer over each fin and the Si substrate;
    forming a first silicon oxy-nitride layer over the first gate oxide layer;
    forming a sacrificial oxide layer over the silicon oxy-nitride layer;
    removing the sacrificial oxide and first silicon oxy-nitride layers and thinning the first gate oxide layer;
    forming a second gate oxide layer over the thinned gate oxide layer;
    forming a second silicon oxy-nitride layer over the second gate oxide layer;
    removing the second silicon oxy-nitride and gate oxide layers over the core logic fin and a portion of the Si substrate;
    forming an interfacial layer (IL) over the core logic fin and the portion of the Si substrate; and
    forming a hafnium oxide (HfOx) layer over the second silicon oxy-nitride layer and ILs.

2. The method according to claim 1, comprising forming the first gate oxide layer by:
    forming ALD silicon dioxide ($SiO_2$) by plasma-enhanced atomic layer deposition (PEALD) or thermal ALD at a temperature of 385° C. to 425° C.; and
    performing a remote plasma treatment using oxygen ($O_2$) or ozone ($O_3$) gas to generate radical oxygen for ALD $SiO_2$ growth.

3. The method according to claim 1, comprising forming the first silicon oxy-nitride layer by:
    plasma nitridation at a room temperature and up to 450° C. with 9% to 12% of nitrogen (N); and
    post nitridation annealing at a temperature of 900° C. to 1000° C. for 30 seconds to 60 seconds.

4. The method according to claim 1, comprising forming the second silicon oxy-nitride layer by:
    plasma nitridation and annealing 3% to 5% of N at a room temperature and up to 450° C.

5. The method according to claim 1, wherein the sacrificial oxide layer comprises titanium dioxide ($TiO_2$), aluminium oxide ($Al_2O_3$), silicon nitride ($Si_3N_4$), lanthanum oxide ($LaO_x$), $SiO_2$, thermal ALD oxide or $HfO_x$.

6. The method according to claim 1, wherein the first and second gate oxide layers comprises $SiO_2$ or thermal ALD oxide.

7. The method according to claim 1, wherein the thinned gate and second gate oxide layers are an inner spacer.

8. The method according to claim 1, comprising removing the sacrificial oxide layer by dilute hydrofluoric acid (dHF) etching.

9. The method according to claim 1, comprising thinning the first gate oxide layer to a thickness of 22 Å to 35 Å by wet etching, wherein the wet etching comprises a 100:1 dHF solution (100 parts water ($H_2O$), 1 part HF).

10. The method according to claim 1, comprising removing the second silicon oxy-nitride and thinned gate oxide layer over the core logic fin and the portion of the Si substrate by:
    forming a photoresist over the second silicon oxy-nitride layer over the HV I/O fin and the portion of the Si substrate;

removing the second silicon oxy-nitride layer over the thinned gate oxide layer over the core logic fin by ultraviolet (UV) lithography;

removing the thinned gate oxide layer over the core logic fin and the portion of the Si substrate by dHF etching; and removing the photoresist.

11. The method according to claim 1, comprising forming the IL over the core logic fin by $O_3$/HCL process.

12. A method comprising:

providing a high voltage input/output (HV I/O) and a core logic laterally separated on a silicon (Si) substrate, each HV I/O and core logic having a fin;

forming a first gate oxide layer to a thickness of 30 angstrom (Å) to 45 Å over each fin and the Si substrate by plasma-enhanced atomic layer deposition (PEALD) or thermal ALD at a temperature of 385° C. to 425° C., and performing a remote plasma treatment using $O_2$ or $O_3$ gas to generate radical $O_2$ for ALD $SiO_2$ growth;

forming a first silicon oxy-nitride layer over the first gate oxide layer by plasma nitridation at a room temperature and up to 450° C. with 9% to 12% of nitrogen (N) and post nitridation annealing at a temperature of 900° C. to 1000° C. for 30 seconds to 60 seconds;

forming a sacrificial oxide layer over the silicon oxy-nitride layer by PEALD;

removing the sacrificial oxide and first silicon oxy-nitride layers by dilute hydrofluoric acid (dHF) etching;

thinning the gate oxide layer to a thickness of 22 Å to 35 Å by wet etching;

forming a second gate oxide layer to a thickness of 1 Å to 35 Å over the thinned gate oxide layer by PEALD or thermal ALD;

forming a second silicon oxy-nitride layer over the second gate oxide layer;

removing the second silicon oxy-nitride and gate oxide layers over the core logic fin and a portion of the Si substrate by ultraviolet (UV) lithography and dHF etching, respectively;

forming an interfacial layer (IL) to a thickness of 6 Å to 12 Å over the core logic fin and the portion of the Si substrate by $O_3$/HCL process; and forming a hafnium oxide (HfOx) layer to a thickness of 15 Å to 28 Å over the second silicon oxy-nitride layer and ILs by ALD.

13. The method according to claim 12, wherein the sacrificial oxide layer comprises titanium dioxide ($TiO_2$), aluminium oxide ($Al_2O_3$), silicon nitride ($Si_3N_4$), lanthanum oxide ($LaO_x$), $SiO_2$, thermal ALD oxide or $HfO_x$.

14. The method according to claim 12, wherein the first and second gate oxide layers comprises $SiO_2$ or thermal ALD oxide.

15. The method according to claim 12, wherein the wet etching comprises a 100:1 dHF solution (100 parts $H_2O$, 1 part HF).

* * * * *